(12) United States Patent
Lehr et al.

(10) Patent No.: US 6,716,678 B2
(45) Date of Patent: Apr. 6, 2004

(54) METHOD FOR PRODUCING AN ANTIFUSE AND ANTIFUSE FOR THE SELECTIVE ELECTRICAL CONNECTION OF ADJACENT CONDUCTIVE REGIONS

(75) Inventors: Matthias Lehr, Dresden (DE); Uwe Schilling, Dresden (DE); Veronika Polei, Bad Schandau (DE); Irene Sperl, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/378,243

(22) Filed: Mar. 3, 2003

(65) Prior Publication Data
US 2003/0157752 A1 Aug. 21, 2003

Related U.S. Application Data

(63) Continuation of application No. PCT/EP01/09427, filed on Aug. 16, 2001.

(30) Foreign Application Priority Data

Sep. 1, 2000 (DE) .......................................... 100 43 215

(51) Int. Cl.$^7$ ............................................... H01L 21/82
(52) U.S. Cl. ........................ 438/131; 438/600; 257/530
(58) Field of Search .............................. 438/131, 132, 438/600, 601; 257/530, 529

(56) References Cited

U.S. PATENT DOCUMENTS

| 5,449,947 | A | | 9/1995 | Chen et al. | |
|---|---|---|---|---|---|
| 5,592,016 | A | * | 1/1997 | Go et al. | 257/530 |
| 5,602,053 | A | | 2/1997 | Zheng et al. | |
| 5,759,876 | A | | 6/1998 | Singlevich et al. | |
| 5,811,870 | A | * | 9/1998 | Bhattacharyya et al. | 257/530 |
| 5,856,213 | A | | 1/1999 | Love et al. | |
| 5,904,507 | A | * | 5/1999 | Thomas | 438/131 |
| 6,245,663 | B1 | * | 6/2001 | Zhao et al. | 438/622 |
| 2002/0173132 | A1 | * | 11/2002 | Tews | 438/600 |
| 2003/0092247 | A1 | * | 5/2003 | Hsieh et al. | 438/467 |

FOREIGN PATENT DOCUMENTS

JP        05090527 A        4/1993

OTHER PUBLICATIONS

Michael John Sebastian Smith: "Application–Specific Integrated Circuits", *Addison Wesley Longman, Inc., 1997,* chapter 4.1, pp. 169–174.

* cited by examiner

Primary Examiner—John F. Niebling
Assistant Examiner—Jennifer M. Kennedy
(74) Attorney, Agent, or Firm—Laurence A. Greenberg; Werner H. Stemer; Gregory L. Mayback

(57) ABSTRACT

A method for producing antifuse structures and antifuses by which adjacent conductive regions can be selectively electrically connected involve the application of a sacrificial layer to a first conductive region. The sacrificial layer is patterned with the aid of a photolithographic method. A fuse layer is applied and the sacrificial layer is then removed. A non-conductive layer is applied and a conductive material is introduced in an opening in the non-conductive layer for the purpose of forming a second conductive region.

8 Claims, 2 Drawing Sheets

METHOD FOR PRODUCING AN ANTIFUSE AND ANTIFUSE FOR THE SELECTIVE ELECTRICAL CONNECTION OF ADJACENT CONDUCTIVE REGIONS

CROSS-REFERENCE TO RELATED APPLICATION

This application is a continuation of International Application No. PCT/EP01/09427, filed Aug. 16, 2001, which designated the United States and was not published in English.

BACKGROUND OF THE INVENTION

Field of the Invention

The invention relates to a method for producing antifuses and to an antifuse for the selective electrical connection of adjacent conductive regions.

Fuses are generally understood to be conductive connections which are integrated in an integrated circuit and which can be separated by specific measures after the completion of the circuit, in order to perform specific, individual settings for the integrated circuit. In this case, they maintain their setting even in the absence of a supply voltage, i.e. they are quite generally characterized by a permanent physical connection or separation of two contacts. So-called laser fuses are the most common. These are formed by thin interconnects which can be severed with a laser beam depending on the desired setting and, as a result, the conductive connection is opened.

Antifuses are disclosed for example in the reference titled "Application-Specific Integrated Circuits", Ch. 4.1, 1997, Addison Wesley Longman, Inc. They are the opposite of a conventional fuse, i.e. they constitute an initially open switch which can be closed by a suitable measure, e.g. by the application of a programming current. Antifuses usually are formed of thin insulating layers between two conductive contacts. They are switched by the insulating layer being made conductive after the application of a programming voltage.

Integrated antifuses generally contain a dielectric layer which is applied on a contact or interconnect layer and on which a further contact region is situated. Such antifuse structures are usually produced by a dielectric layer being deposited over the whole area and then being removed again essentially over the whole area, except in the fuse regions defined lithographically, by dry etching (i.e. reactive ion etching (RIE)), so that islands made of a dielectric material remain on the contact layer. In this method, the contact or interconnect layers of the bottom interconnect plane which are freed of the dielectric layer by the RIE process are attacked and their surface is altered in an undesirable manner.

SUMMARY OF THE INVENTION

It is accordingly an object of the invention to provide a method for producing an antifuse and antifuse for the selective electrical connection of adjacent conductive regions that overcome the above-mentioned disadvantages of the prior art methods and devices of this general type, which provides an improved method for producing antifuses.

With the foregoing and other objects in view there is provided, in accordance with the invention, a method for producing an antifuse. The method includes the steps of providing a first conductive region, applying a sacrificial layer to the first conductive region, patterning the sacrificial layer resulting in an opening being formed in the sacrificial layer above the first conductive region, applying a fuse layer at least in a region of the opening in the sacrificial layer, removing the fuse layer lying on a surface of the sacrificial layer with an aid of a chemical mechanical polishing method, removing the sacrificial layer, applying a non-conductive layer, forming an further opening in the non-conductive layer above the first conductive region, and introducing a conductive material into the further opening resulting in a formation of a second conductive region.

According to the invention, it is provided that antifuses for the selective electrical connection of adjacent conductive regions are produced by a sacrificial layer being applied to the surface of a first conductive region, which is situated in a non-conductive region of a substrate. The sacrificial layer is patterned e.g. with the aid of a photolithographic method, so that a window is produced above the first conductive region. A fuse layer is applied to the sacrificial layer that has been patterned in this way. The fuse layer is preferably a dielectric layer. During the subsequent removal of the sacrificial layer, the latter is removed together with the fuse layer deposited thereon, so that the fuse layer remains only in the region of the window previously introduced into the sacrificial layer. A non-conductive layer is applied thereon, which layer is provided with contact openings into which conductive material is introduced in order to form a second conductive region.

The production method has the advantage that open conductive regions are not at any time exposed to an etching method or another harmful process by which they can be attacked and damaged. Moreover, the method constitutes a simple production method by which both standard contacts and antifuse contacts can be jointly produced in a process sequence in a simple manner.

In a particular embodiment, it is provided that the fuse layer is formed from a dielectric material and furthermore has a contact layer via which contact is made between the dielectric material of the fuse layer and of the second conductive region. This has the advantage that the contact layer can be used as an etching stop layer during the step of introducing the contact opening into the non-conductive layer. It is thus possible to avoid the situation in which the dielectric layer is etched through in the event of excessively long action of the etching process for the production of the contact holes and an electrical connection is then produced between the first and second conductive regions and, consequently, a fuse contact is not formed.

In a preferred embodiment, it is provided that the removal of the sacrificial layer furthermore contains previously freeing the surface of the sacrificial layer of the fuse layer with the aid of a chemical mechanical polishing method. As a result, the sacrificial layer is more easily accessible to a subsequent selective etching process, in which the etchant is chosen such that it does not attack the fuse layer. If the fuse layer situated on the sacrificial layer were not removed by a CMP method, it would be expedient to carry out a further masking step before an etching process for jointly removing the fuse layer and the sacrificial layer. The masking step is then necessary in order to protect the fuse layer on the first conductive region against the etching process, because the etchant to be used etches the fuse layer and the sacrificial layer.

In accordance with an added feature of the invention, the dielectric material is formed from $Si_3N_4$, SiON, and/or $SiO_2$.

The sacrificial layer is formed from BPSG, BSG, Poly-Si, a-Si, Al, Ti, or TiN. The first and second conductive regions are formed from tungsten.

Other features which are considered as characteristic for the invention are set forth in the appended claims.

Although the invention is illustrated and described herein as embodied in a method for producing an antifuse and an antifuse for the selective electrical connection of adjacent conductive regions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1A:
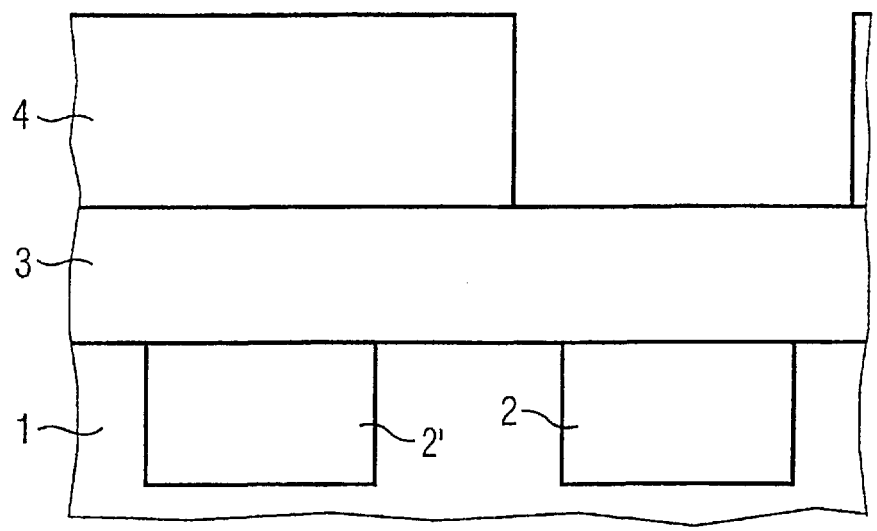
FIGS. 1A to 1E are diagrammatic, cross-section views through a semiconductor structure, i.e. an antifuse, according to the invention after different process steps.

The structures shown in the figures are not to scale. Referring now to the figures of the drawing in detail and first, particularly, to FIGS. 1A–1E thereof, there is shown a production method that is carried out on a substrate material which is preferably processed with the aid of standard planar technology in which a sequence of individual processes is carried out which each act on the wafer surface over the whole area and lead to the local alteration of the semiconductor material in a targeted manner by way of suitable masking layers.

The starting material used is a non-illustrated preprocessed substrate wafer preferably essentially made of silicon, on the surface of which is situated an oxide layer 1, into which are introduced conductive regions 2, 2' made of tungsten, the surfaces of which are uncovered. A sacrificial layer 3 is applied to the surface of the substrate pretreated in this way. The sacrificial layer 3 may contain BPSG, BSG, polysilicon, amorphous silicon or correspondingly different materials depending on the etching chemistry. The sacrificial layer 3 is preferably patterned with the aid of a photolithographic process. In this case, a photoresist layer 4 is applied to the sacrificial layer 3 and patterned photoligthographically, so that the sacrificial layer 3 is not covered by the photoresist layer 4 over the conductive regions 2 on which an antifuse structure is intended to be formed.

Figure 1B:
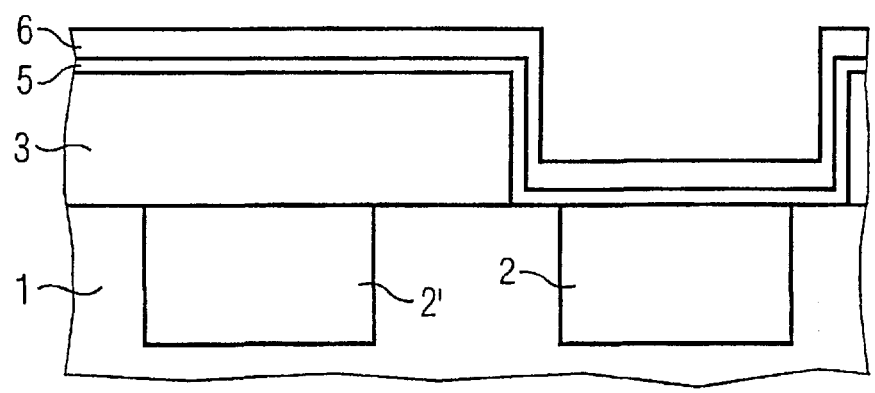
Figure 1C:
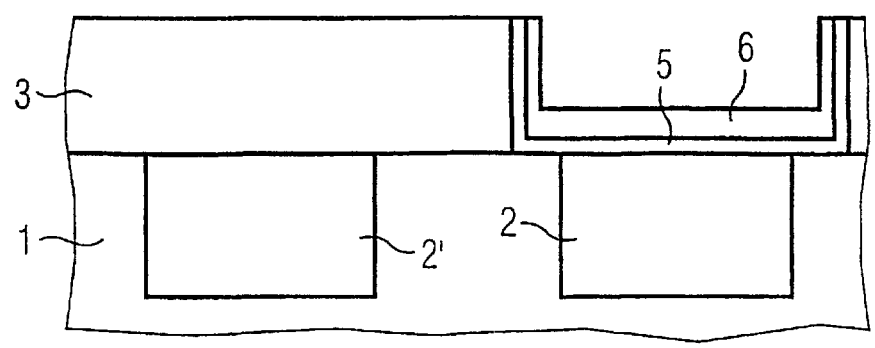

As shown in FIG. 1B, through a window in the resist layer 4, the sacrificial layer 3 is uncovered down to the surface of the conductive region 2. The photoresist layer 4 is then removed and a dielectric layer 5 and a contact-making layer 6 are subsequently applied over the whole area. The dielectric layer 5 is preferably composed of a dielectric material such as $Si_3N_4$, SiON or $SiO_2$, but it is also possible to use other dielectric materials. The contact-making layer 6 is composed of a material which is conductive and which forms a stable connection to the dielectric layer 5.

In a subsequent step (FIG. 1C), the dielectric layer 5 and the contact-making layer 6 on the surface of the sacrificial layer 3 are removed by a chemical mechanical polishing (CMP) method where the latter is situated on the sacrificial layer 3. The layers 5, 6 in the previously uncovered window of the sacrificial layer 3 remain. A structure is thus obtained in which the sacrificial layer 3 is uncovered and wherein the dielectric layer 5 and the contact-making layer 6 are situated in the region above the conductive region 2. The dielectric layer 5 and the contact-making layer 6 can also be removed by an etching method, the region above the conductive region 2 then having to be masked in order that the layers 5, 6 are not removed by the etching step.

Figure 1D:
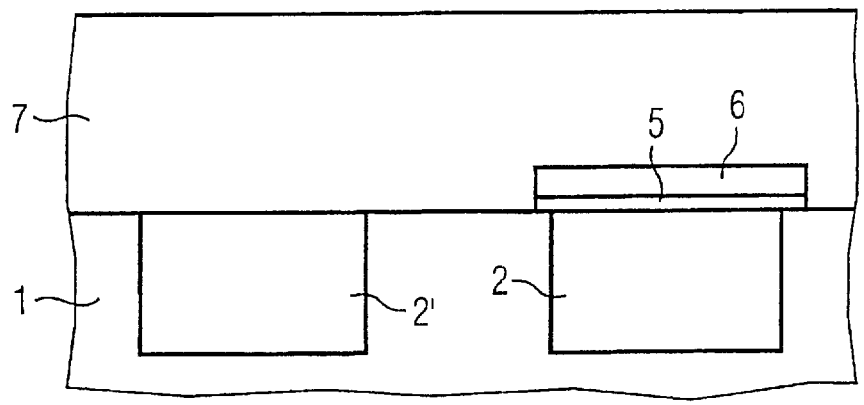

FIG. 1D illustrates a structure as is produced after the removal of the sacrificial layer 3 and the subsequent application of an oxide layer 7. In this case, depending on the material used, the sacrificial layer 3 can be etched using $H_2SO_4$/HF-containing solutions or comparable etchants.

Figure 1E:
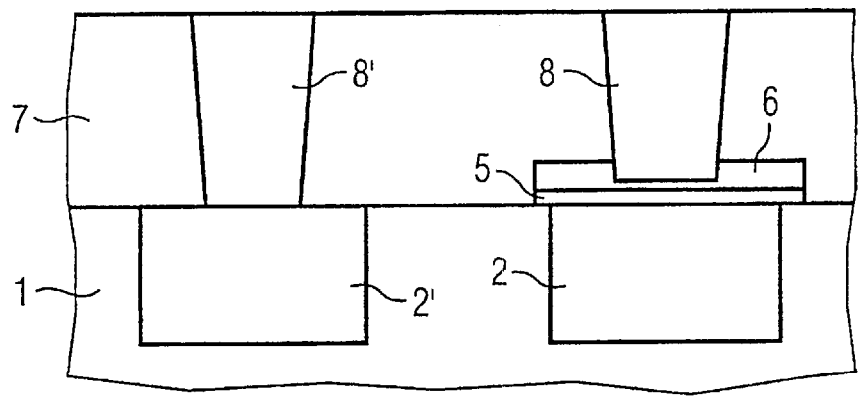

In the oxide layer 7, windows are then provided as illustrated in FIG. 1E, at the locations at which the contact connections are to be made, with the aid of a photolithographic masking and subsequent etching, which windows extend through the oxide layer 7 completely or as far as the contact-making layer 6, depending on whether a simple contact connection of the conductive region 2' situated below the oxide layer is intended to be made or an antifuse structure is intended to be formed. The etching method or the etchants of the etching process are chosen such that the etching process ends in the case of the antifuse structure either after the etching-through of the oxide layer 7 in a manner defined by the etching time or after the contact-making layer 6 is reached. In this case, the contact-making layer 6 serves as an etching stop layer, so that the dielectric layer 5 is protected against being etched through. A conductive material, e.g. tungsten, which forms a low-resistance connection to the contact-making layer, is then introduced into the contact-making openings thus produced. Contacts 8, 8' accessible from the surface are formed in this way.

As can be seen from the method sequence described above, it is thus possible to produce both standard contacts 2', 8' and antifuse contacts 2, 8 simultaneously by one production method. In this case, the conductive regions 2, 2' are protected with the sacrificial layer 3 over the whole area and afterward only the regions at which the antifuse structure is to be produced are uncovered and provided with the dielectric layer 5. As a result, it is possible to avoid the situation in which the conductive regions 2, 2' are exposed to an etching process whereby they can be attacked and damaged. The subsequent processes of introducing contact openings in the oxide layer 7 and filling the contact openings with a conductive material are identical for the production of standard contacts and antifuse structures.

In a preferred production method, it is provided that the dielectric layer 5 is composed of $Si_3N_4$, the sacrificial layer 3 is composed of BPSG or BSG, which is removed with the aid of a wet-chemical lift-off method by use of $H_2SO_4$/HF-containing solutions. Since the etching rate of $H_2SO_4$/HF-containing solutions in the case of BPSG or BSG is significantly higher than that in the case of $Si_3N_4$, the sacrificial layer 3 can be removed virtually with no impairment of the dielectric layer 5.

For the production method according to the invention, it is not necessary to provide a contact-making layer 6. It is suitable, however, as an etching stop layer for the contact-making openings of the conductive region 8, whereby the dielectric layer 5 can be protected against being etched through. With the use of suitable etching chemistry, however, it is also conceivable that the dielectric layer 5 itself can constitute such an etching stop layer, as a result of which the use of the contact-making layer 6 becomes superfluous.

Figure 2:
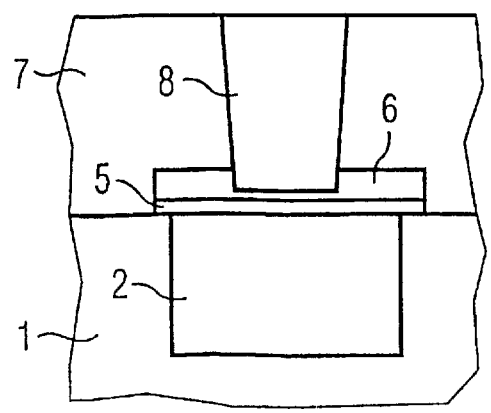
FIG. 2 is a diagrammatic sectional view of the antifuse that has been produced by the method according to FIGS. 1A–1E.

FIG. 2 diagrammatically illustrates an antifuse that has been produced according to the method described above. It has the first conductive region 2, which is embedded in the oxide layer 1 on the substrate. The dielectric fuse layer 5 is situated on the first conductive region 2, and covers the first conductive region 2. A precise alignment is not necessary. Situated above the dielectric fuse layer 5 is the contact-making layer 6, which is provided for process reasons. It primarily serves to avoid destruction or damage of the fuse layer 2 in subsequent process steps. Situated on the contact-making layer 6 is the oxide layer 7, in which is situated a contact opening which reaches as far as the contact-making layer 6 and into which the conductive material 8, e.g. tungsten, is introduced. It goes without saying that it may be provided that further conductive regions that, under certain circumstances, are in contact with the conductive region may be provided below the conductive layer 2.

The features of the invention which are disclosed in the above description, the drawings and the claims may be of importance both individually and in any desired combination for the realization of the invention in its various configurations.

We claim:

1. A method for producing an antifuse, which comprises the steps of:

providing a first conductive region;

applying a sacrificial layer to the first conductive region;

patterning the sacrificial layer resulting in an opening being formed in the sacrificial layer above the first conductive region;

applying a fuse layer at least in a region of the opening in the sacrificial layer;

removing the fuse layer lying on a surface of the sacrificial layer with an aid of a chemical mechanical polishing method;

removing the sacrificial layer;

applying a non-conductive layer;

forming an further opening in the non-conductive layer above the first conductive region; and introducing a conductive material into the further opening resulting in a formation of a second conductive region.

2. The method according to claim 1, which comprises forming the fuse layer from a dielectric material.

3. The method according to claim 1, which comprises forming the fuse layer from a layer sequence made of dielectric materials.

4. The method according to claim 1, which comprise forming the fuse layer with a contact layer.

5. The method according to claim 2, which comprises selecting the dielectric material from at least one compound selected the group consisting of $Si_3N_4$, SiON, and $SiO_2$.

6. The method according to claim 1, which comprises forming the sacrificial layer from a material selected from the group consisting of BPSG, BSG, Poly-Si, a-Si, Al, Ti, and TiN.

7. The method according to claim 1, which comprises using an $H_2SO_4$/HF-containing solution for removing the sacrificial layer.

8. The method according to claim 1, which comprises forming at least one of the first and second conductive regions from tungsten.

* * * * *